United States Patent [19]

Lee

[11] Patent Number: 5,206,833
[45] Date of Patent: Apr. 27, 1993

[54] PIPELINED DUAL PORT RAM

[75] Inventor: Sheau-Jiung Lee, Taipei, Taiwan

[73] Assignee: Acer Incorporated, Hsin Chu Science-Based Industrial Park, Taiwan

[21] Appl. No.: 668,543

[22] Filed: Mar. 13, 1991

Related U.S. Application Data

[63] Continuation-in-part of Ser. No. 243,394, Sep. 12, 1988, abandoned.

[51] Int. Cl.$^5$ .............................................. G11C 7/04
[52] U.S. Cl. ................................. 365/233; 365/189.02; 365/189.05; 365/230.02; 365/230.05; 340/703
[58] Field of Search .................... 365/189.02, 189.05, 365/230.02, 230.05, 233; 340/703, 720

[56] References Cited

U.S. PATENT DOCUMENTS

| | | | |
|---|---|---|---|
| 4,484,187 | 11/1984 | Brown et al. ........................ | 340/703 |
| 4,503,490 | 3/1985 | Thompson ............................ | 365/233 |
| 4,506,348 | 3/1985 | Miller et al. ...................... | 365/189.02 |
| 4,511,965 | 4/1985 | Rajaram ............................... | 340/703 |
| 4,719,601 | 1/1988 | Gray et al. ....................... | 365/189.02 |
| 4,804,948 | 2/1989 | Nishi et al. ......................... | 340/703 |
| 4,825,390 | 4/1989 | Van Aken et al. ................. | 340/720 |
| 4,882,709 | 11/1989 | Wyland ........................... | 365/189.02 |
| 4,970,693 | 11/1990 | Nozaki et al. ...................... | 365/233 |

Primary Examiner—John S. Heyman
Attorney, Agent, or Firm—Greg T. Sueoka

[57] ABSTRACT

A pipelined random access memory for use in color display system. A multiplexer, including a video port and a microprocessor port, provides the RAM input. A memory array, a sensing latch and an I/O latch, in addition to the multiplexer, provide the pipeline architecture, enabling the random memory to be accessed at three different locations simultaneously. Thus, with the same memory speed, the data throughput of this RAM is triple that in the known art. A clock circuit is constructed to generate extremely stable internal clock pulses so that the interval of each clock pulse varies automatically according to the IC manufacturing process and the ambient temperature in use, thereby adapting to the appropriate precharging interval related to the memory array, multiplexer, and sensing latch.

2 Claims, 4 Drawing Sheets

PIPELINED DUAL PORT RAM

CROSS-REFERENCE TO RELATED APPLICATION

This application is a continuation-in-part of application Ser. No. 07/243,394, filed Sep.12, 1988, now abandoned.

BACKGROUND OF THE INVENTION

1. Field of the Invention

The present invention relates to random access memory (RAM). More specifically, it relates to a pipelined dual port RAM for use in a "color palette" to display a plurality of colors on an analog color monitor.

2. Description of the Prior Art

Referring to FIG. 5, a block diagram of a known color palette circuit is shown. A central processing unit (CPU) A sends address, data and control signals to a video controller B, which formats the information from CPU A, and stores the formatted information in video RAM C. Each pixel of the image to be displayed is represented by 8 bits, which are transmitted to Random Access Memory Digital-to-Analog Converter (RAMDAC) D. The RAMDAC is composed of a random access memory and a digital-to-analog converter. The random access memory, also known as a color palette, in the RAMDAC receives the 8 bit signal representing a pixel from video RAM C and converts the 8 bit signal into an 18-bit signal, each 6 bits of which stands for a respective red, green or blue (R,G,B) signal. The 6 bits of color signal allow for 64 levels of color for each one of the R,G,B signals, resulting in a total of $64^3$ or 256K different colors. The monitor can display 256 different colors at any given instant. The 18 bit signals are converted into analog signals by means of the digital-to-analog converter in RAMDAC D and are fed to analog monitor E. An extremely stable and precise clock is needed for the aforesaid technique. In the known art, a phase locked loop (PLL) has been used to generate the clock pulses. However, this approach is complicated and expensive.

SUMMARY OF THE INVENTION

The present invention uses external clock pulses to produce a series of very accurate internal clock pulses, thereby providing the high precision clock pulses required by the RAMDAC circuit.

The present invention also employs a pipeline architecture for the RAM portion of the color palette circuit, whereby the data throughput can be three or more times faster than in the known art, thus enabling the rapid changing of images displayed on the monitor.

The present invention also provides a multiplexer employing pseudo-static AND gates, which can be used in this invention, as well as other circuitry, to create a circuit of low power consumption, high density and fast access speed.

DESCRIPTION OF THE SPECIFIC EMBODIMENT(S)

Figure 1:
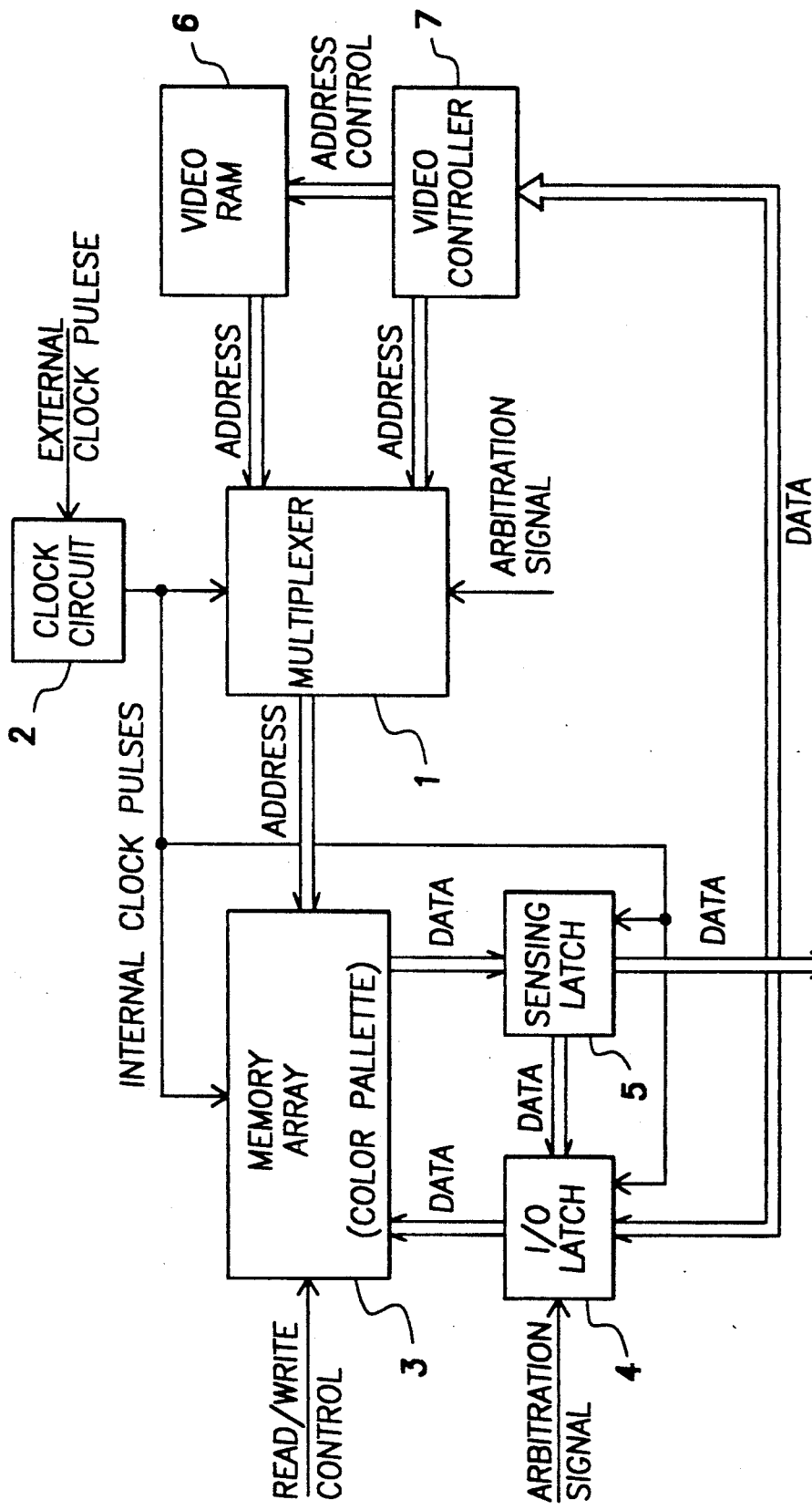
FIG. 1 is a block diagram of the present invention.

Referring to FIG. 1, a pipelined dual port RAM 10 of the present invention comprises a multiplexer 1, a clock circuit 2, a memory array 3, an I/O latch 4 and a sensing latch 5. Multiplexer 1 has two ports: a video port and a microprocessor port. The video port receives memory addresses from video RAM 6 while the microprocessor port accepts memory addresses delivered from video controller 7, thereby altering the data in memory array 3 to change colors on the monitor. Asynchronous access to the video port and microprocessor port within multiplexer 1 is regulated by an arbitration signal in cooperation with internal clock pulses generated by clock circuit 2.

There are two signal paths within the pipelined dual port RAM: one is from the video port to sensing latch 5 through memory array 3, and the other from the microprocessor port to I/O latch 4 through memory array 3. This arrangement forms a pipeline architecture wherein access to memory array 3 is divided into three separate parts. Therefore, with the same access speed of random access memory, the "data throughput" of this memory array can be raised to triple that of the known art.

Figure 2:
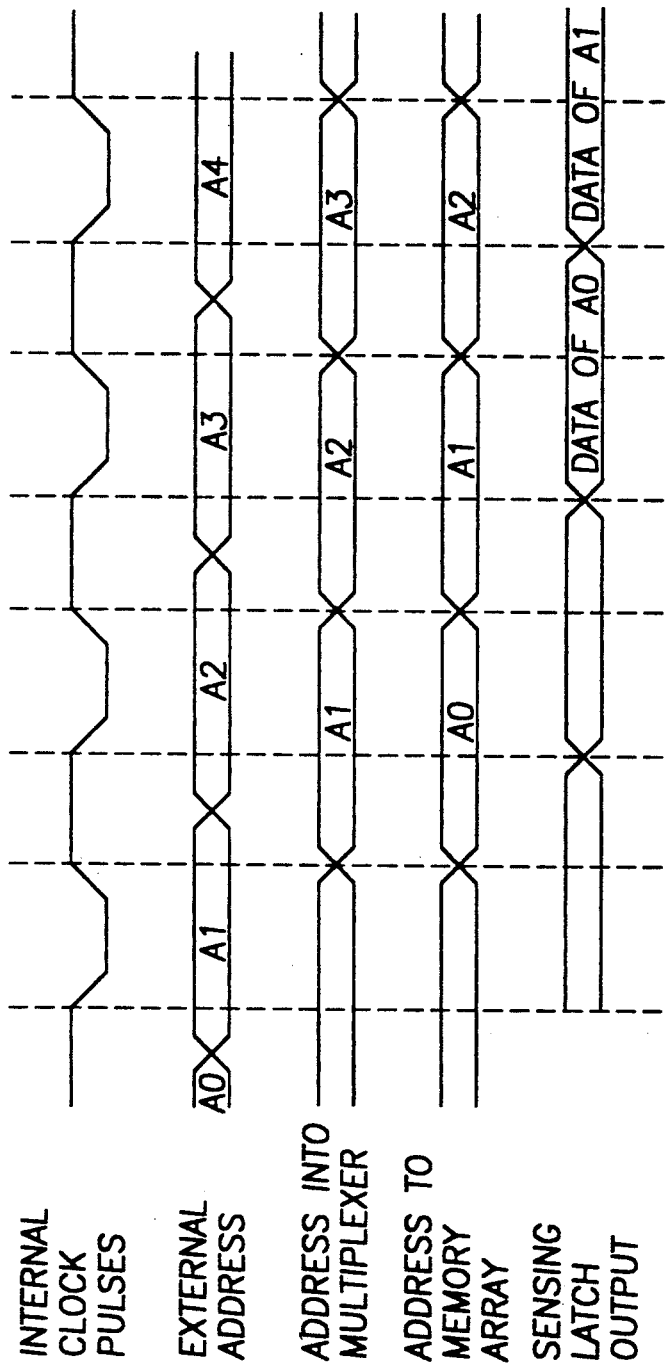
FIG. 2 shows the timing relationship of signals in various portions of the present invention.

With reference to FIG. 2, a timing diagram of the pipeline architecture of the present invention is shown. The clock pulses in the diagram refer to internal clock pulses after conversion from external clock pulses. An address signal input into the video port or microprocessor port, such as A2, is clocked into the port on the falling edge of the internal clock pulse. Both multiplexer 1 and memory array 3 are disabled during a clock pulse's low level, while memory array 3 and multiplexer 1 are enabled on the rising edge of the internal clock pulse. In the next positive half cycle, the A2 signal appears at multiplexer 1, while the A1 signal, the preceding address signal, exists in memory array 3. In addition to locking the address into the port and disabling the multiplexer and memory array when the clock pulse is transitioning from a high level to a low level, the addressed data in the memory array 3 is clocked into the I/O latch 4 and sensing latch 5. Thus, the A2 signal remains at the multiplexer 1, the A1 signal appears in the memory array 3, and the data of the A0 address signal exists in the sensing latch 5. The arbitration of the video port and the microprocessor port occurs at the multiplexer. Therefore, the arbitration time is one clock period.

To achieve the pipelined architecture, a series of very precise clock pulses is required to control the process. The clock pulse must be very stable, and compensate for temperature variations and variances in the integrated circuit manufacturing process.

Figure 3:
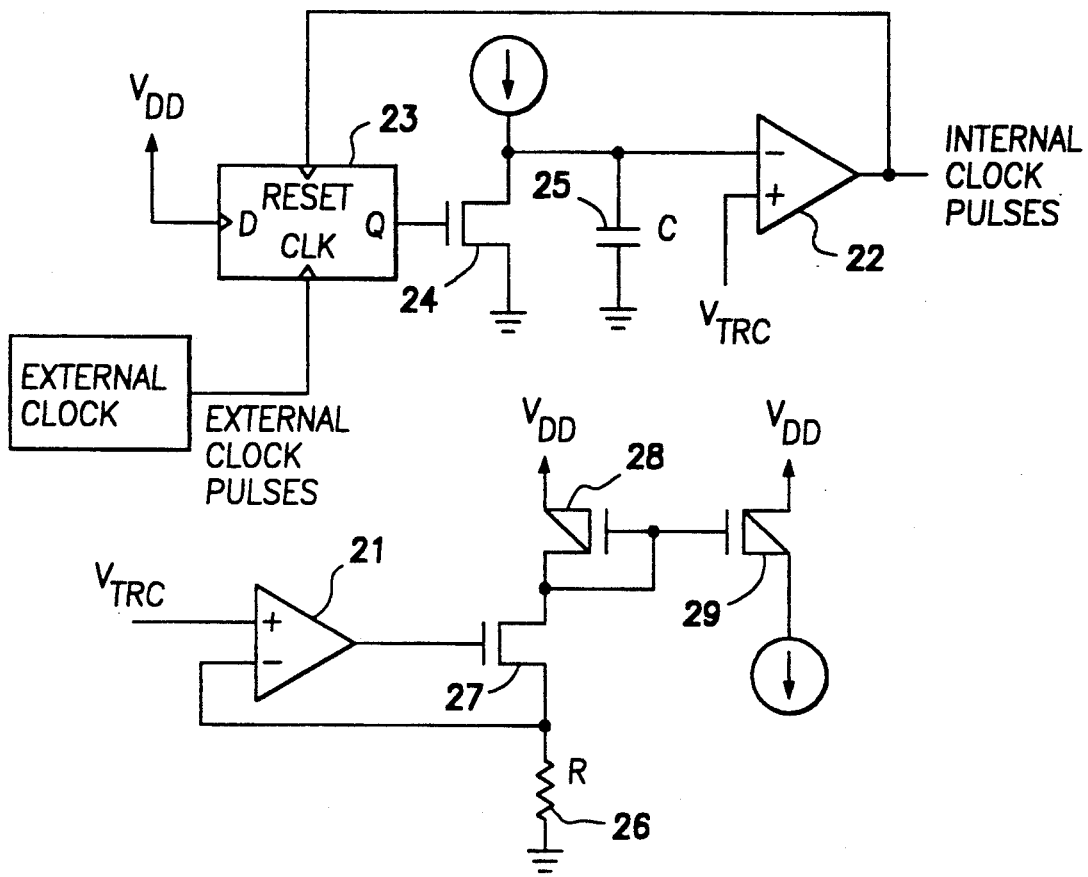
FIG. 3 is a circuit diagram of a clock circuit that converts a series of external clock pulses into high precision internal clock pulses.

FIG. 3 illustrates a circuit employed to generate accurate clock pulses. It comprises a pair of differential amplifiers 21 and 22, a D-type flip-flop 23, an N-channel MOSFET 24, a capacitor 25 and a resistor 26. The "+" terminal of differential amplifier 21 is coupled to a reference voltage $V_{trc}$, and the "−" terminal to resistor 26 whose resistance is R. The other end of resistor 26 is grounded. The current flowing through resistor 26 is thus a constant one, whose value is $V_{trc}/R$. Further, an N-channel MOSFET 27, a P-channel MOSFET 28 and a P-channel MOSFET 29 comprise a "current mirror", whose function is to maintain a fixed current regardless of variations of voltage, so that the source terminal of P-channel MOSFET 29 is presented with a constant current $V_{trc}/R$.

This constant current of $V_{trc}/R$ is applied to the drain terminal of MOSFET 24. A $V_{dd}$ voltage is connected to the D input terminal of D-type flip-flop 23, while external clock pulses are applied to the clock terminal of flip-flop 23. In the rising edge of the clock pulse, this D-type flip-flop is triggered and the output thereof becomes a "1". N-channel MOSFET 24 becomes conductive, and capacitor 25, whose capacitance is C, discharges through MOSFET 24. The "+" terminal of differential amplifier 22 is also attached to a reference voltage $V_{trc}$ and the "−" terminal to capacitor 25. When the voltage on the capacitor is lower than $V_{trc}$ and approaches ground potential, the output of differential amplifier 22, i.e. the internal clock pulse, is at high level (a "1"). This output is also coupled to a "Reset" terminal of D-type flip-flop 23 so that flip-flop 23 is reset, and the Q terminal thereof becomes a "0". Then, the N-channel MOSFET 24 is cut off, and the constant current source starts to charge capacitor 25 until the voltage on capacitor 25 exceeds $V_{trc}$, the output of differential amplifier 22 changing to a low level (a "0") in response thereto. The whole process is repeated forming the internal clock pulses required.

It should be noted that the charging time of the capacitor 25, i.e. the high level interval of each cycle of the internal clock pulses, is $$ti\ t = RC + \text{variable}$$

where RC is a fixed value, and the variable varies with IC manufacturing process variables and the ambient temperature. This interval is the time utilized for "precharging" the memory array, multiplexer and sensing latch. Because the RC value is bias independent, the precharging interval, in addition to a fixed amount of RC value, comprises a variable time which will track the IC manufacturing process variations and the ambient temperature, whereby the high level interval of the internal clock pulses will automatically adjust to a proper time interval, regardless of the stability of the high level interval of the external clock pulses.

Figure 4:
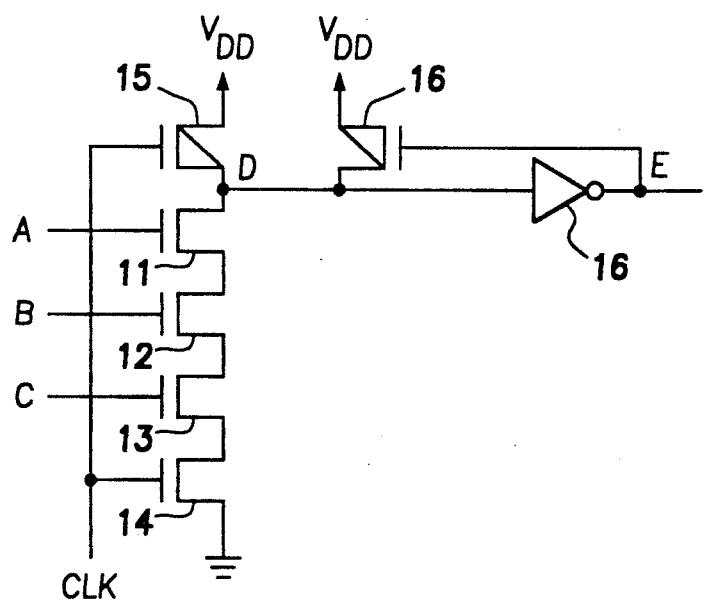
FIG. 4 is a circuit diagram showing a pseudo-static AND gate in accordance with the invention.
Figure 5:
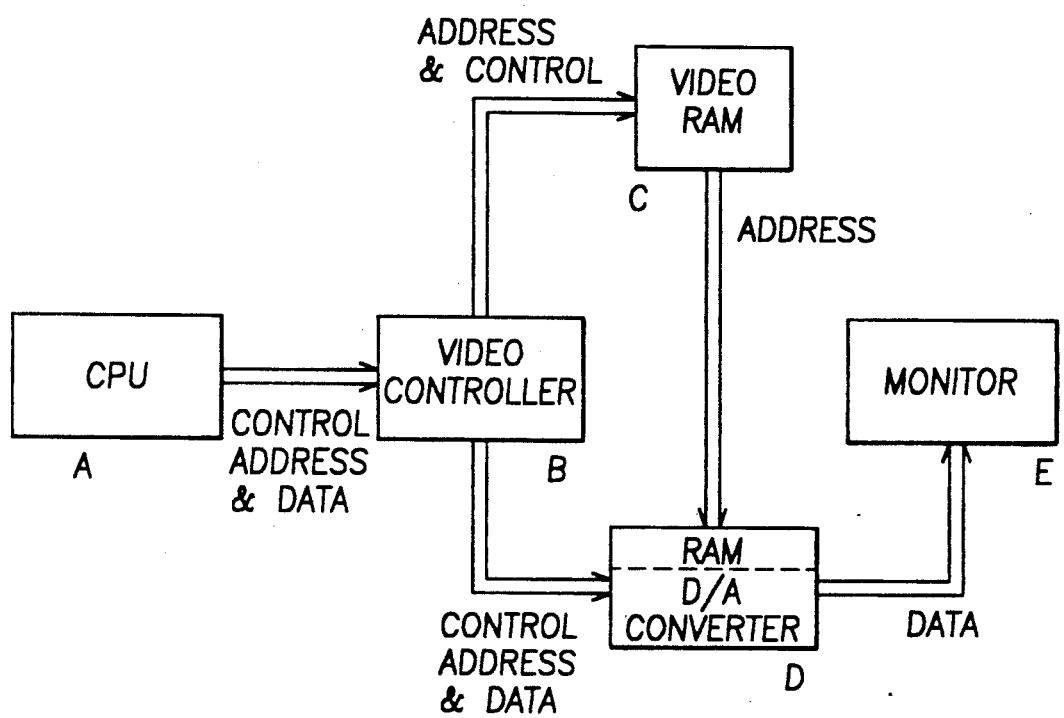
FIG. 5 is a block diagram illustrating a known color palette system.

FIG. 4 illustrates the pseudo-static AND gate used to build the multiplexer. When the input terminals A, B and C are all coupled to a "1" (high voltage level), N-channel MOSFETS 11, 12 and 13 all conduct. When clock pulse Clk is high N-channel MOSFET 14 also conducts and P-channel MOSFET 15 is off. Node "D" is pulled to ground potential. Meanwhile, the output terminal "E" of an invertor 17 is a "1", which is coupled to the gate of a feedback holding transistor 16 of P-channel MOSFET type, so that the feedback holding transistor is off, holding node "D" at "0", and node "E" at "1". In case any of input terminals A,B and C change to a "0", the respective N-channel MOSFET is cut off. As the clock pulse Clk changes to "0", the P-channel MOSFET 15 is turned on, node "D" becomes a "1" and node "E" changes to a "0". In the meantime, the feedback holding transistor 16 is conductive, and node "D" is coupled to the $V_{dd}$ voltage through the holding transistor 16. Thus, even if the clock pulse becomes a high level thereafter, turning off the P-channel MOSFET 15, node "D" remains a "1", node "E" a "0". Therefore, the output at node "E" of this circuit is that of a standard AND gate, and the output at node "D" is that of a standard NAND gate.

It should be clear that the input terminals are not restricted to three but can be any number desired. It should also be noted that the feedback holding transistor 16 can be made very small since its main function is to prevent the "D" point from floating, one of the main drawbacks of dynamic circuitry. Accordingly, the pseudo-static AND gate of the present invention can be manufactured much smaller than the ordinary AND gate of static type, whereas its "refresh" procedure is much simpler than that of dynamic circuitry.

From the aforesaid, the construction and operation of the present invention will be readily understood. However, since numerous modifications and changes will readily occur to those skilled in the art, it is not desired to limit the invention to the exact circuit construction shown and described, but to those modifications and equivalents within the scope of the appended claims.

What is claimed is:

1. A pipelined dual port Random Access Memory, comprising:
   a multiplexer having a video port and a microprocessor port, wherein said video port receives address signals from a video memory and said microprocessor port accepts address signals from a video controller, the multiplexer being controlled by an arbitration signal to regulate asynchronous access of the addressed memory;
   a memory array connected to receive address signals from the video memory through the multiplexer to output digital data in addressed cells of said memory array;
   a sensing latch connected to receive digital data from the memory array, and to deliver the digital data to a digital-to-analog converter;
   an I/O latch, coupled to the memory array, the video controller and the sensing latch, said I/O latch capable of storing digital data read from said memory array through an output of the sensing latch and capable of storing digital data to be written to said memory array from the video controller under the coordination of an arbitration signal; and
   a clock circuit for converting external clock pulses into internal clock pulses, said clock circuit being coupled to the multiplexer, memory array, sensing latch and I/O latch, to supply the internal clock pulses thereto.

2. A pipeline dual port Random Access Memory, comprising:
   a) a multiplexer having a video port and a microprocessor port, wherein said video port receives address signals from a video memory and said microprocessor port accepts address signals from a video controller, the multiplexer being controlled by an arbitration signal to regulate asynchronous access of random access memory data specified by an output of the multiplexer;
   b) a memory array connected to receive address signals from the video memory through the multiplexer to output digital data in addressed cells of said memory array;
   c) a sensing latch connected to receive digital data from the memory array, and to deliver the digital data to a digital-to-analog converter;
   d) an I/O latch coupled to the memory array, the video controller and said sensing latch, said I/O latch capable of storing digital data read from said memory array through an output of the sensing latch and capable of storing digital data to be written to said memory array from the video controller under the coordination of an arbitration signal; and e) a clock circuit for converting external clock pulses into internal clock pulses, said clock circuit being coupled to the multiplexer, memory array, sensing latch and I/O latch, to supply internal clock pulses thereto, the clock circuit comprising:

a D-type flip-flop in which a D input terminal is connected to a positive power supply voltage $V_{dd}$ and a Clk input terminal is connected to receive the external clock pulses;

an N-channel MOSFET having a gate connected to an output terminal of said D-type flip-flop, a drain connected to an output of a constant current source and to a first terminal of a capacitor, and a source connected to a second terminal of said capacitor and to a ground potential;

a differential amplifier having one input terminal coupled to a reference voltage, another input terminal connected to said first terminal of the capacitor, and an output terminal connected to a Reset terminal of said D-type flip-flop; and wherein said clock circuit is characterized in that an output of said differential amplifier produces clock pulses, and a high level time interval and low level time interval of said clock pulses are decided by an RC time constant plus a time quantity determined by IC manufacturing processes and an ambient temperature, where C is a capacitance of said capacitor and R is a resistance of said constant source.

* * * * *